(12) United States Patent
Tomita

(10) Patent No.: US 11,899,256 B2
(45) Date of Patent: Feb. 13, 2024

(54) PLUGGABLE OPTICAL MODULE AND OPTICAL COMMUNICATION SYSTEM

(71) Applicant: NEC Corporation, Tokyo (JP)

(72) Inventor: Isao Tomita, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/093,468

(22) Filed: Jan. 5, 2023

(65) Prior Publication Data

US 2023/0170998 A1 Jun. 1, 2023

Related U.S. Application Data

(60) Continuation of application No. 16/951,424, filed on Nov. 18, 2020, now Pat. No. 11,606,144, which is a
(Continued)

(30) Foreign Application Priority Data

Jul. 9, 2015 (JP) .................................. 2015-137821

(51) Int. Cl.
*G02B 6/42* (2006.01)
*H04B 10/40* (2013.01)
(Continued)

(52) U.S. Cl.
CPC ............. *G02B 6/4292* (2013.01); *G02B 6/42* (2013.01); *G02B 6/4246* (2013.01);
(Continued)

(58) Field of Classification Search
CPC ...... G02B 6/42; G02B 6/4246; G02B 6/4261; G02B 6/428; G02B 6/4292; G02F 1/00;
(Continued)

(56) References Cited

U.S. PATENT DOCUMENTS

| 5,121,241 A | 6/1992 | Veith |
| 9,319,142 B2 | 4/2016 | Kato et al. |
| | (Continued) | |

FOREIGN PATENT DOCUMENTS

| CN | 101753252 A | 8/2010 |
| CN | 103513351 A | 1/2014 |
| | (Continued) | |

OTHER PUBLICATIONS

Japanese Office Action for JP Application No. 2021-168463 dated Nov. 29, 2022 with English Translation.
(Continued)

*Primary Examiner* — Michael P Mooney
(74) *Attorney, Agent, or Firm* — Sughrue Mion, PLLC

(57) ABSTRACT

A pluggable optical connector is configured to be insertable into and removable from an optical communication apparatus, and to be capable of communicating a modulation signal and a data signal with the optical communication apparatus. A wavelength-tunable light source is configured to output an output light and a local oscillation light. An optical transmission unit is configured to output an optical signal generated by modulating the output light in response to the modulation signal. An optical reception unit is configured to demodulate an optical signal received by using the local oscillation light to the data signal. Pluggable optical receptors are configured in such a manner that an optical fiber is insertable into and removable from the pluggable optical receptors, and configured to be capable of outputting the optical signal to the optical fiber and transferring the optical signal received thorough the optical fiber to the optical reception unit.

12 Claims, 11 Drawing Sheets

Related U.S. Application Data continuation of application No. 16/657,300, filed on Oct. 18, 2019, now Pat. No. 10,890,726, which is a division of application No. 15/740,231, filed as application No. PCT/JP2016/002735 on Jun. 7, 2016, now abandoned.

(51) Int. Cl.

| | | |
|---|---|---|
| *H04B 10/61* | (2013.01) | |
| *H01S 5/02251* | (2021.01) | |
| *H01S 5/0239* | (2021.01) | |
| *H01S 5/50* | (2006.01) | |
| *H01S 5/00* | (2006.01) | |
| *H01S 5/14* | (2006.01) | |
| *H01S 5/02216* | (2021.01) | |
| *G02F 1/01* | (2006.01) | |
| *H01S 5/022* | (2021.01) | |
| *G02F 2/00* | (2006.01) | |

(52) U.S. Cl.
CPC ........ *H01S 5/0239* (2021.01); *H01S 5/02251* (2021.01); *H01S 5/50* (2013.01); *H04B 10/40* (2013.01); *H04B 10/61* (2013.01); *G02F 1/01* (2013.01); *G02F 2/00* (2013.01); *H01S 5/005* (2013.01); *H01S 5/0064* (2013.01); *H01S 5/0071* (2013.01); *H01S 5/022* (2013.01); *H01S 5/02216* (2013.01); *H01S 5/142* (2013.01)

(58) Field of Classification Search
CPC ... G02F 1/01; G02F 2/00; H01S 5/022; H01S 5/02251; H01S 5/02284; H01S 5/142; H01S 5/50; H04B 10/40; H04B 10/61005; H04B 10/0064; H04B 10/0071; H04B 10/02216

See application file for complete search history.

(56) References Cited

U.S. PATENT DOCUMENTS

| | | | |
|---|---|---|---|
| 10,447,387 B2 | 10/2019 | Yamamoto | ............. H04B 10/03 |
| 10,890,726 B2 | 1/2021 | Tornita | ...................... H01S 5/50 |
| 11,606,144 B2 * | 3/2023 | Tomita | ................. G02B 6/4246 |
| 2008/0031620 A1 | 2/2008 | Hudgins et al. | |
| 2011/0317998 A1 | 12/2011 | Gee et al. | |
| 2012/0069854 A1 | 3/2012 | Suzuki | |
| 2012/0099864 A1 | 4/2012 | Ishihara et al. | |
| 2013/0070254 A1 | 3/2013 | Winzer | |
| 2013/0156077 A1 | 6/2013 | Au et al. | |
| 2013/0170843 A1 | 7/2013 | Bansy | |
| 2016/0072586 A1 | 3/2016 | Hochberg et al. | |
| 2017/0117969 A1 | 4/2017 | Fludger et al. | |

FOREIGN PATENT DOCUMENTS

| | | |
|---|---|---|
| CN | 203883951 U | 10/2014 |
| JP | H04-109722 A | 4/1992 |
| JP | 2009-194025 A | 8/2008 |
| JP | 2009-278015 A | 11/2009 |
| JP | 2011-142191 A | 7/2011 |
| JP | 2015-79092 A | 4/2015 |
| JP | 2015-094812 A | 5/2015 |
| JP | 2015-95513 A | 5/2015 |
| WO | 2011/120248 A1 | 10/2011 |
| WO | 2012113447 A1 | 8/2012 |
| WO | 2013/180291 A1 | 12/2013 |
| WO | 2014/141685 A1 | 9/2014 |

OTHER PUBLICATIONS

Japanese Office Communication for JP Application No. 2019-210430 dated Sep. 14, 2021 with English Translation.

Japanese Office Action for JP Application No. 2019-210430 dated Feb. 2, 2021 with English Translation.

Communication dated Oct. 11, 2019, from the China National Intellectual Property Administration in counterpart Application No. 201680040558.X.

Communication dated Apr. 16, 2019 by the Japanese Patent Office in counterpart application No. 2017-527061.

Hajime Shoji, et al., "Compact and Low Power Dissipation Optical Devices for Digital Coherent Optical Communication", 2013 Nen IEICE Communications Society Conference Koen Ronbunshu 2, Sep. 3, 2013, pp. ss-149 to ss-150.

International Search Report for PCT/JP2016/002735 dated Jul. 12, 2016 [PCT/ISA/210].

Wang et al., "Optical Fiber Sensing Technology", Xidian University Press. Mar. 31, 2015, pp. 26-27 (total 2 pages).

Wladek Forysiak, "Progress in InP-based Photonic Components and Sub-systems for Digital Coherent Systems at 100Gbit/s and beyond", ECOC 2013. ISBN 978-1-84919-759-5, Sep. 2013.

Written Opinion for PCT/JP2016/002735 dated Jul. 12, 2016 [PCT/ISA/237].

Wu et al., "The Design of 100G Coherent Optical Module", Value Engineering, Jul. 31, 2012, vol. 31 (18), pp. 181-182 (total 2 pages).

CN Office Action for CN Application No. 202110824532.7, dated Nov. 29, 2023 with English Translation.

Youzhao Wang et al., "Optical Fiber Sensing Technology", University of Electronic Science and Technology Press, pp. 26-27, Mar. 31, 2015, China.

\* cited by examiner

PLUGGABLE OPTICAL MODULE AND OPTICAL COMMUNICATION SYSTEM

CROSS REFERENCE TO RELATED APPLICATIONS

This application is a continuation application of U.S. patent application Ser. No. 16/951,424 filed on Nov. 18, 2020, which is a continuation application of U.S. patent application Ser. No. 16/657,300 filed on Oct. 18, 2019, which is issued as U.S. Pat. No. 10,890,726, which is a divisional application of U.S. patent application Ser. No. 15/740,231 filed on Dec. 27, 2017, which is a National Stage of International Application No. PCT/JP2016/002735 filed on Jun. 7, 2016, claiming priority based on Japanese Patent Application No. 2015-137821 filed on Jul. 9, 2015, the contents of all of which are incorporated herein by reference in their entirety.

TECHNICAL FIELD

The present invention relates to a pluggable optical module and an optical communication system.

BACKGROUND ART

In recent years, due to rapid increase in communication traffic, expansion of transmission capacity has been needed. In response to this, a speed and capacity of an optical network system have been progressed. Thus, miniaturization and speed-up of an optical module, which is a key device of the optical network system, is required.

Digital coherent communication that performs multi-level phase modulation of an optical signal has become general as a method for achieving large capacity of an optical communication system. Even in the digital coherent communication, the miniaturization and speed-up of the optical module are also required.

In general, a digital coherent transceiver used for the digital coherent communication includes both of an optical signal transmission function and an optical signal reception function. In this case, a wavelength-tunable light source, which outputs a light modulated to generate an optical signal by an optical modulator in the optical signal transmission function, and a wavelength-tunable light source, which outputs a local oscillation light used for detecting an optical signal in the optical signal reception function, are needed (e.g. Patent Literatures 1 and 2).

CITATION LIST

Patent Literature

[Patent Literature 1] Japanese Unexamined Patent Application Publication No. 2009-278015
[Patent Literature 2] Japanese Unexamined Patent Application Publication No. 2009-194025

SUMMARY OF INVENTION

Technical Problem

However, the inventor has found that the above-described digital coherent transceiver includes some problems described below. In the above-described digital coherent transceiver, two wavelength-tunable light sources are needed so that it is necessary to secure space for mounting the two wavelength-tunable light sources. As a result, it is difficult to miniaturize the digital coherent transceiver.

In a pluggable optical module used for the digital coherent communication, it is also necessary to mount a plurality of optical components such as a transmission optical module, a reception optical module, the wavelength-tunable light sources, an input/output interface, and the like. Meanwhile, since the miniaturization is required as described below, mounting the two wavelength-tunable light sources hinders the realization of miniaturization.

The present invention has been made in view of the aforementioned circumstances and aims to achieve a compact pluggable optical module used for digital coherent communication.

Solution to Problem

An aspect of the present invention is a pluggable optical module including: a pluggable optical connector configured to be insertable into and removable from an optical communication apparatus, and to be capable of communicating a modulation signal and a data signal with the optical communication apparatus; a wavelength-tunable light source configured to output an output light and a local oscillation light that have a predetermined wavelength; an optical transmission unit configured to output a first optical signal generated by modulating the output light in response to the modulation signal; an optical reception unit configured to demodulate a second optical signal received by using the local oscillation light to the data signal and output the demodulated data signal; and an pluggable optical receptor configured in such a manner that an optical fiber is insertable into and removable from the pluggable optical receptor, and configured to be capable of outputting the first optical signal to the optical fiber and transferring the second optical signal received thorough the optical fiber to the optical reception unit.

An aspect of the present invention is an optical communication system comprising: an optical fiber configured to transmit an optical signal; a pluggable optical module configured to output a first optical signal to the optical fiber and receive a second optical signal through the optical fiber, the optical fiber being insertable into and removable from the pluggable optical module; and an optical communication apparatus configured in such a manner that the pluggable optical module is insertable into and removable from the optical communication apparatus, in which the pluggable optical module comprises: a pluggable optical connector configured to be insertable into and removable from the optical communication apparatus, and to be capable of communicating a modulation signal and a data signal with the optical communication apparatus; a wavelength-tunable light source configured to output an output light and a local oscillation light that have a predetermined wavelength; an optical transmission unit configured to output the first optical signal generated by modulating the output light in response to the modulation signal; an optical reception unit configured to demodulate the second optical signal received by using the local oscillation light to the data signal and output the demodulated data signal; and an pluggable optical receptor configured in such a manner that the optical fiber is insertable into and removable from the pluggable optical receptor, and configured to be capable of outputting the first optical signal to the optical fiber and transferring the second optical signal received thorough the optical fiber to the optical reception unit.

Advantageous Effects of Invention

According to the present invention, it is possible to achieve a compact pluggable optical module used for digital coherent communication.

DESCRIPTION OF EMBODIMENTS

Figure 1:
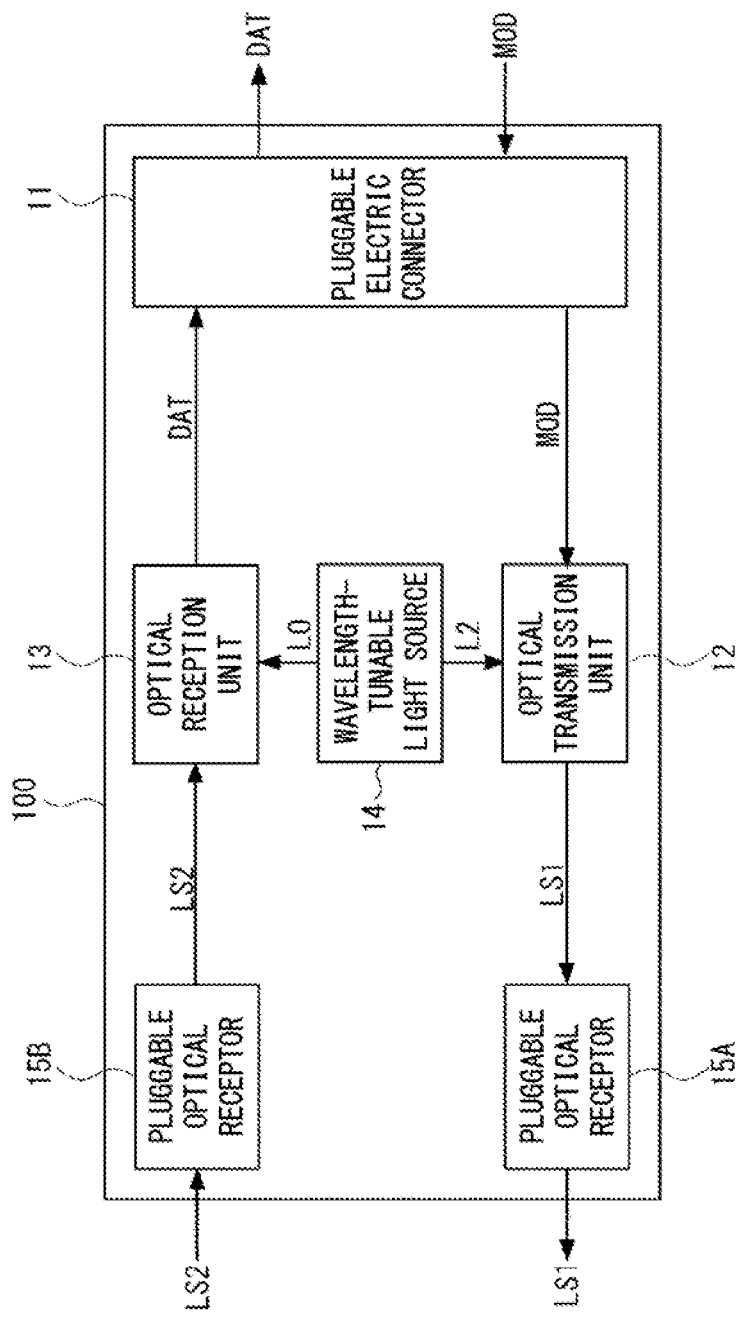
FIG. 1 is a block diagram schematically illustrating a configuration of a pluggable optical module according to a first exemplary embodiment.

Exemplary embodiments of the present invention will be described below with reference to the drawings. The same components are denoted by the same reference numerals throughout the drawings, and a repeated explanation is omitted as needed.

First Exemplary Embodiment

Figure 2:
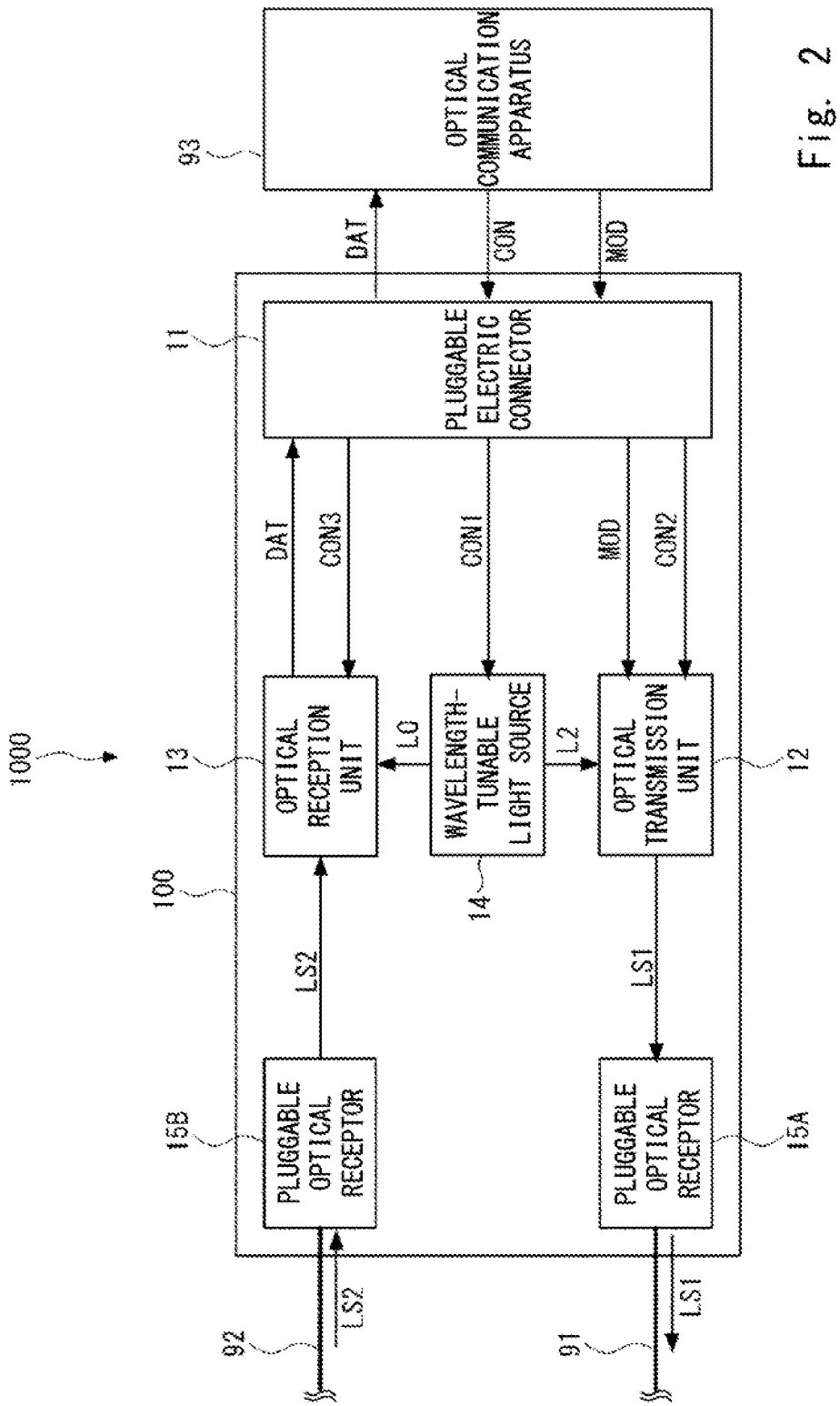
FIG. 2 is a block diagram illustrating a configuration example of a main part of an optical communication system in which the pluggable optical module according to the first exemplary embodiment is mounted.

A pluggable optical module 100 according to a first exemplary embodiment will be described.
The pluggable optical module 100 is configured to be capable of performing digital coherent optical communication with an external communication apparatus. FIG. 1 is a block diagram schematically illustrating a configuration of the pluggable optical module 100 according to the first exemplary embodiment. FIG. 2 is a block diagram illustrating a configuration example of a main part of an optical communication system 1000 in which the pluggable optical module 100 according to the first exemplary embodiment is mounted.

As illustrated in FIG. 2, the pluggable optical module 100 is configured in such a manner that connectors of an optical fiber with connector 91 and an optical fiber with connector 92 are insertable into and removable from the pluggable optical module 100. An LC connector and MU connector can be used as the connectors of the optical fiber with connector 91 and the optical fiber with connector 92. The pluggable optical module 100 is controlled based on a control signal CON input from an optical communication apparatus 93 that is a communication host. The pluggable optical module 100 can also receive a modulation signal MOD that is a data signal from the optical communication apparatus 93 with the control signal CON. In this case, the pluggable optical module 100 can output an optical signal LS1 (also referred to as a first optical signal), which is modulated based on the received modulation signal MOD, through the optical fiber 91. The pluggable optical module 100 can also output a data signal DAT corresponding to an optical signal LS2 (also referred to as a second optical signal), which is received from the outside through the optical fiber 92, to the optical communication apparatus 93. For example, the optical communication apparatus 93 performs communication signal processing such as framing processing of a communication data signal from the pluggable optical module 100 or a communication data signal input to the pluggable optical module 100.

The pluggable optical module 100 includes a pluggable electric connector 11, an optical transmission unit 12, an optical reception unit 13, a wavelength-tunable light source 14, and pluggable optical receptors 15A and 15B.

The pluggable electric connector 11 is configured to be insertable into and removable from the optical communication apparatus 93. The pluggable electric connector 11 is configured to be capable of receiving the control signal CON that is an electric signal output from the optical communication apparatus 93 and transferring a predetermined control signal to a part or all of the optical transmission unit 12, the optical reception unit 13, and the wavelength-tunable light source. The pluggable electric connector 11 receives the modulation signal MOD that is an electric signal output from the optical communication apparatus 93 and transfers the modulation signal MOD to the optical transmission unit 12. The pluggable electric connector 11 transfers the data signal DAT output from the optical reception unit 13 to the optical communication apparatus 93.

Figure 3:
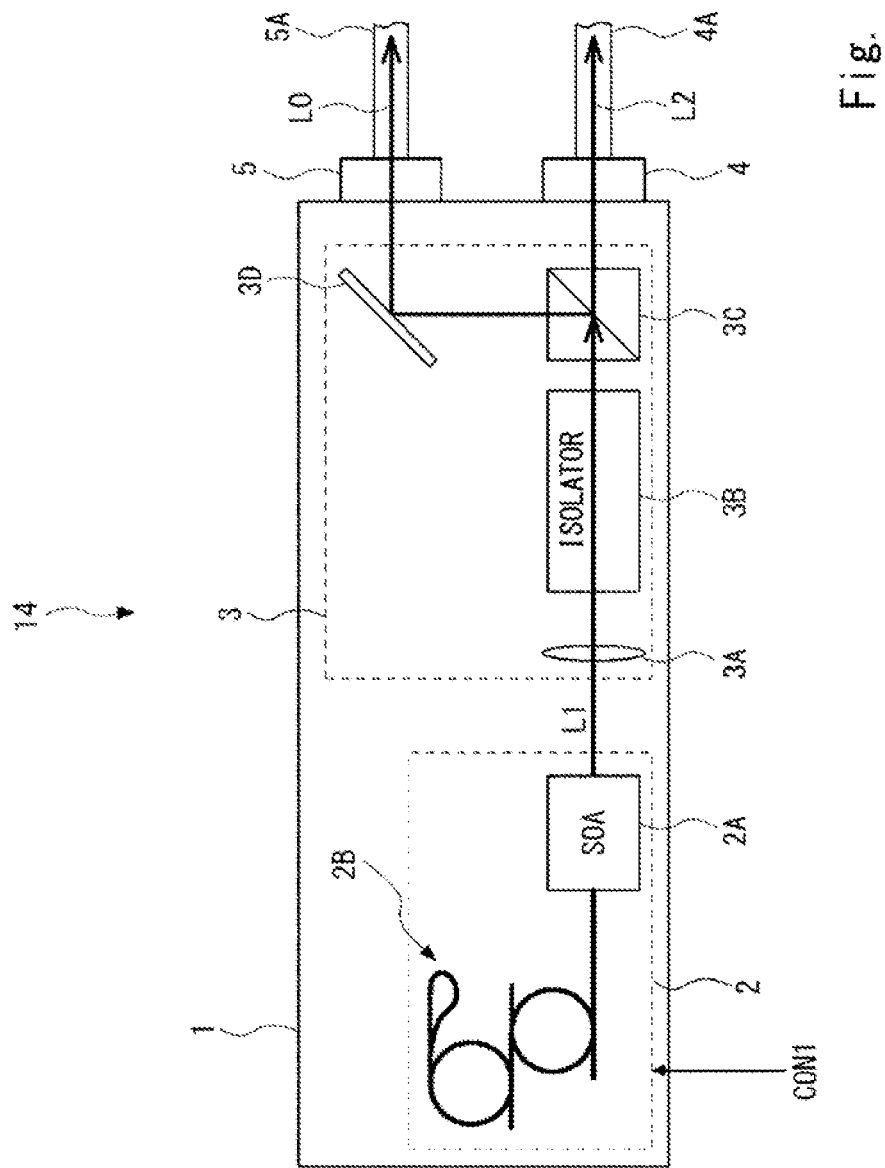
FIG. 3 is a block diagram illustrating a configuration example of a wavelength-tunable light source according to the first exemplary embodiment.

The wavelength-tunable light source 14 is configured as a wavelength-tunable optical module that outputs a light having a wavelength determined in response to the control signal CON, for example. FIG. 2 illustrates an example in which a control signal CON1 based on the control signal CON is input to the wavelength-tunable light source 14. A configuration example of the wavelength-tunable light source 14 will be described. FIG. 3 is a block diagram illustrating the configuration example of the wavelength-tunable light source 14 according to the first exemplary embodiment. The wavelength-tunable light source 14 includes a carrier 1, an optical output unit 2, an optical branching unit 3, and condenser lenses 4 and 5. The optical output unit 2 and the optical branching unit 3 are mounted or formed on the carrier 1.

The optical output unit 2 is configured as a PLC (Planer Lightwave Circuit) that includes an optical waveguide made of quartz, silicon, or the like. The optical output unit 2 includes a semiconductor optical amplifier (referred to as a SOA hereinafter) 2A and a wavelength filter 2B. The SOA 2A is an active optical device that outputs a CW (Continuous Wave) light, and is, for example, a semiconductor laser diode. The wavelength filter 2B is configured, for example, as an external resonator that includes a plurality of ring resonators, a loop mirror, electrodes for applying voltages to the ring resonators, and the like. The SOA 2A and the wavelength filter 2B is arranged in such a manner that waveguides of those are aligned.

The light emitted from the SOA 2A is incident on the wavelength filter 2B. The light incident on the wavelength filter 2B is transmitted through ring resonators and reflected by the loop mirror, and is incident on the SOA 2A. Because diameters of a plurality of ring resonators are slightly different from each other, a wavelength at which peaks of the ring resonators coincide with each other is only one in a wavelength-tunable range. Therefore, a resonance occurs at the wavelength selected by the ring resonators between the loop mirror and the SOA 2A, and, as a result, the optical output unit 2 performs laser oscillation. The laser light output from the SOA 2A is incident on the optical branching unit 3 as a light L1.

In the wavelength filter 2B, an effective refractive index of the ring resonator can be changed by applying the voltage to the electrode disposed on the ring resonator. Therefore, an optical length of the ring resonator can be changed. Thus, by applying the voltage to the electrode, a wavelength of the light L1 output from the optical output unit 2 can be changed. In sum, the optical output unit 2 can function as a wavelength-tunable laser.

The optical branching unit 3 includes a collimator lens 3A, an isolator 3B, a prism 3C, and a mirror 3D. The collimator lens 3A converts the light L1 output from the optical output unit 2 to a parallel light. The isolator 3B is disposed to prevent a returned light. Thus, the isolator 3B is configured to transmit a light incident from a side of the optical output unit 2 and not to transmit a light incident from the opposite side. The light (the parallel light) transmitted through the isolator 3B is branched into an output light L2 and a local oscillation light LO by the prism 3C. The output light L2 transmitted through the prism 3C is emitted through the condenser lens 4. An optical fiber 4A connects between the condenser lens 4 and the optical transmission unit 12, for example, and the output light L2 is incident on the optical transmission unit 12 through the optical fiber 4A. The local oscillation light LO reflected by the prism 3C is emitted through the condenser lens 5. An optical fiber 5A connects between the condenser lens 5 and the optical reception unit 13, for example, and the local oscillation light LO is incident on the optical reception unit 13 through the optical fiber 5A.

Returning to FIG. 1, the optical transmission unit 12 will be described. The optical transmission unit 12 modulates the output light L2 input from the wavelength-tunable light source 14 based on the modulation signal MOD input from the optical communication apparatus 93 through the pluggable electric connector 11, and outputs the modulated light as the optical signal LS1. Here, the optical transmission unit 12 is controlled based on the control signal CON input from the optical communication apparatus 93 through the pluggable electric connector 11. FIG. 2 illustrates an example in which a control signal CON2 based on the control signal CON is input to the optical transmission unit 12. Therefore, the optical transmission unit 12 can perform appropriate modulation operation according to the wavelength of the output light L2.

The optical transmission unit 12 includes, for example, a Mach-Zehnder type optical modulator. The Mach-Zehnder type optical modulator modulates the output light L2 with a predetermined modulation method to output the optical signal LS1. The optical transmission unit 12 modulates the output light L2 by applying a signal according to the modulation signal MOD to phase modulation areas formed on optical waveguides of the Mach-Zehnder type optical modulator. The optical transmission unit 12 can modulate the output light L2 with various modulation methods such as phase modulation, amplitude modulation and polarization modulation, or a combination of the various modulation methods. Here, for example, the Mach-Zehnder type optical modulator is a semiconductor optical modulator or another optical modulator.

Here, the phase modulation area is an area that includes an electrode formed on the optical waveguide. An effective refractive index of the optical waveguide below the electrode is changed by applying an electric signal, e.g. a voltage signal, to the electrode. As a result, a substantial optical length of the optical waveguide in the phase modulation area can be changed. Thus, the phase modulation area can change a phase of the optical signal propagating through the optical waveguide. Then, the optical signal can be modulated by providing a phase difference between the optical signals propagating through two optical waveguides.

Figure 4:
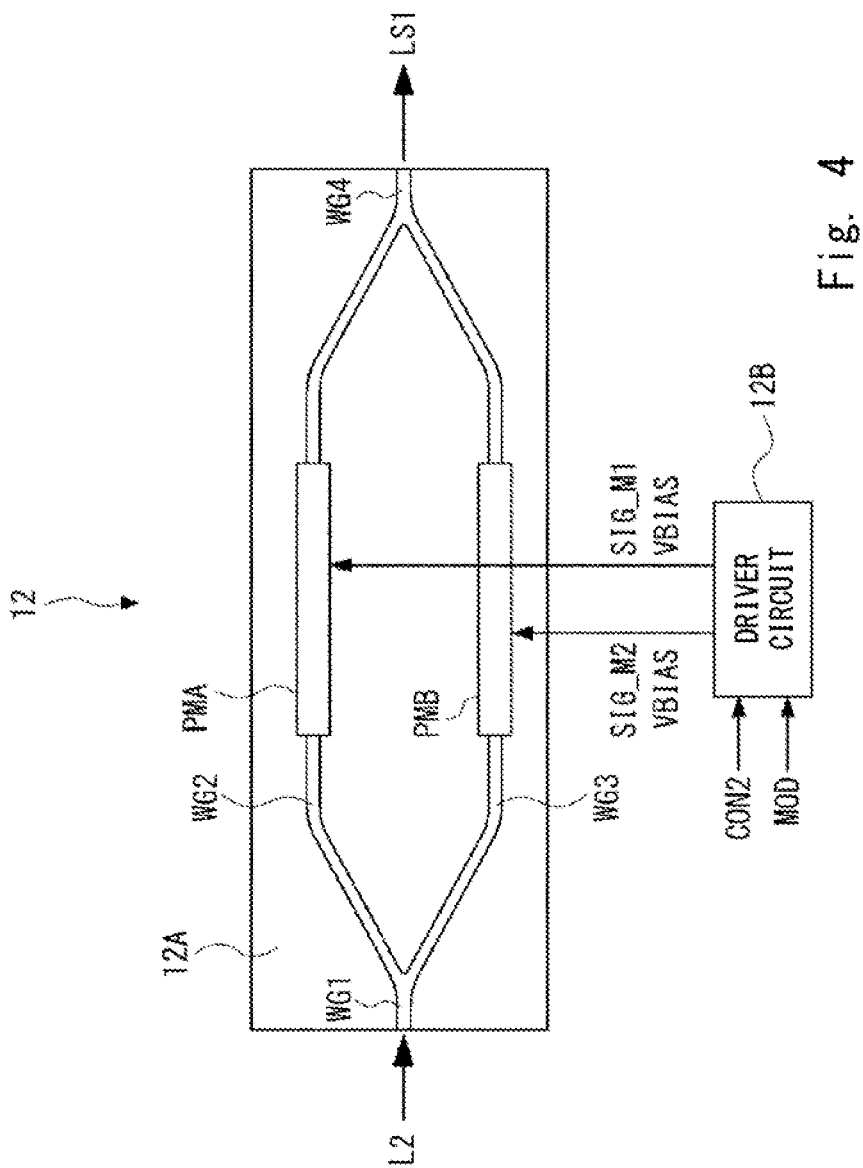
FIG. 4 is a block diagram schematically illustrating a configuration of an optical transmission unit according to the first exemplary embodiment.

A configuration example of the optical transmission unit 12 will be described. FIG. 4 is a block diagram schematically illustrating a configuration of the optical transmission unit 12 according to the first exemplary embodiment. The optical transmission unit 12 is configured as a general Mach-Zehnder type optical modulator. The optical transmission unit 12 includes an optical modulator 12A and a driver circuit 12B.

The optical modulator 12A modulates the output light L2 output from the wavelength-tunable light source 14 to output the optical signal LS1. The optical modulator 12A includes optical waveguides WG1 to WG4, and phase modulation areas PMA and PMB. The output light L2 output from the wavelength-tunable light source 14 is input to one end of the optical waveguide WG1. The other end of the optical waveguide WG1 is optically connected with one end of the optical waveguide WG2 and one end of the optical waveguide WG3. Thus, a light propagating through the optical waveguide WG1 is branched toward the optical waveguide WG2 and the optical waveguide WG3. The other end of the optical waveguide WG2 and the other end of the optical waveguide WG3 are connected with one end of the optical waveguide WG4. On the optical waveguide WG2, the phase modulation area PMA that changes a phase of a light propagating through the optical waveguide WG2 is disposed. On the optical waveguide WG3, the phase modulation area PMB that changes a phase of a light propagating through the optical waveguide WG3 is disposed. The optical signal LS1 is output from the other end of the optical waveguide WG4.

The driver circuit 12B can control a modulation operation of the optical modulator 12A. The driver circuit 12B can also control a bias point of the optical modulator 12A by applying a bias voltage VBIAS to one or both of the phase modulation areas PMA and PMB in response to the control signal CON2. Hereinafter, it is assumed that the driver circuit 12B applies the bias voltage to the phase modulation areas PMA and PMB. The driver circuit 12B can also modulate the output light L2 to the optical signal LS1 by applying the signal according to the modulation signal MOD to one or both of the phase modulation areas PMA and PMB. In this example, the driver circuit 12B applies a modulation signal SIG_M1 in according to the modulation signal MOD to the phase modulation area PMA. The driver circuit 12B applies a modulation signal SIG_M2 according to the modulation signal MOD to the phase modulation area PMB.

Although not illustrated, the optical transmission unit 12 may include an optical power adjustment unit. The optical power adjustment unit may adjust power of the optical signal LS1 by attenuating or blocking the optical signal LS1 output from the optical transmission unit 12. The optical power adjustment unit may adjust the power of the optical signal LS1 in response to the control signal CON or a control signal other than the control signal CON input from the optical communication apparatus 93 through the pluggable electric connector 11. For example, an optical attenuator may be used as the optical power adjustment unit.

The optical reception unit 13 demodulates the optical signal LS2 received from the outside through the optical fiber 92 by causing the optical signal LS2 to interfere with the local oscillation light LO output from the wavelength-tunable light source 14. The optical reception unit 13 outputs the data signal DAT that is a demodulated electric signal to the optical communication apparatus 93 through the pluggable electric connector 11. In this case, the optical reception unit 13 is controlled based on the control signal CON input from the optical communication apparatus 93 through pluggable electric connector 11. FIG. 2 illustrates an example in which a control signal CON3 based on the control signal CON is input to the optical reception unit 13. Therefore, the optical reception unit 13 can perform an appropriate demodulation operation according to the wavelength of the local oscillation light LO (or the output light LS2).

Figure 5:
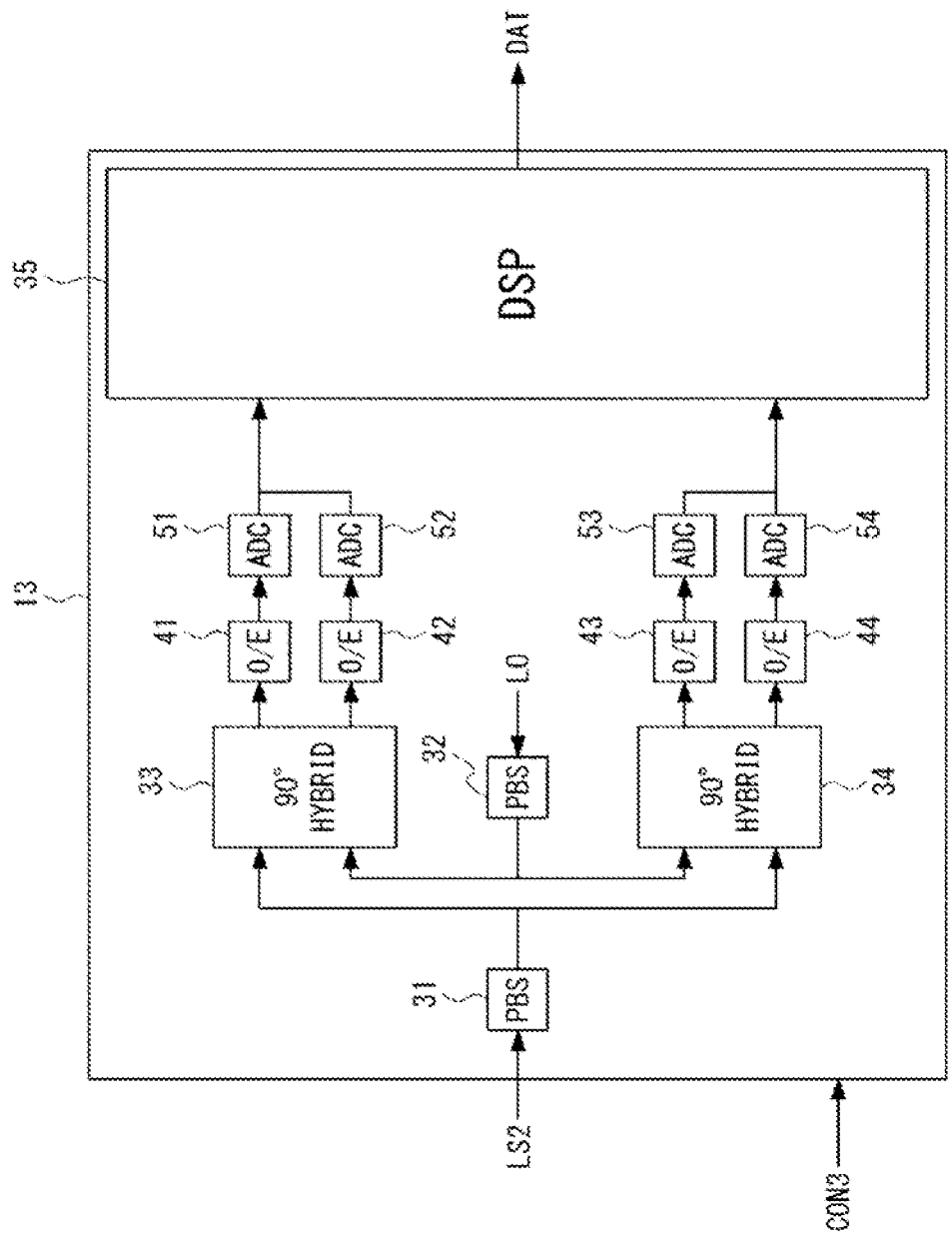
FIG. 5 is a block diagram illustrating a configuration example of an optical reception unit according to the first exemplary embodiment.

The optical reception unit 13 is, for example, a reception unit performing digital coherent reception for demodulating a DP-QPSK (Dual-Polarization Quadrature Phase-Shift Keying) optical signal to an electric signal. FIG. 5 is a block diagram illustrating a configuration example of the optical reception unit 13 according to the first exemplary embodiment. As illustrated in FIG. 5, the optical reception unit 13 includes a polarization beam splitter (referred to as a PBS hereinafter) 31, a PBS32, 90-degree hybrids 33 and 34, optical/electrical converters (referred to as O/Es hereinafter) 41 to 44, analog to digital converters (referred to as ADCs hereinafter) 51 to 54, a digital signal processor (referred to as a DSP hereinafter) 35.

The optical signal LS2 (e.g. the DP-QPSK optical signal) is input to the PBS 31 through the pluggable optical receptor 15B. The PBS 31 splits the input optical signal LS2 into two polarized components orthogonal to each other. Specifically, the PBS 31 splits the optical signal LS2 into an x-polarized component $x_{in}$ and a y-polarized component $Y_{in}$ orthogonal to each other. The x-polarized component $x_{in}$ is input to the 90-degree hybrid 33 and the y-polarized component $y_{in}$ is input to the 90-degree hybrid 34.

The local oscillation light LO is input to the PBS 32 from the wavelength-tunable light source 14. In the present exemplary embodiment, the PBS 32 splits the local oscillation light LO into two polarized components orthogonal to each other (an x-polarized component $LO_x$ and a y-polarized component $LO_y$). The x-polarized component $LO_x$ of the local oscillation light is input to the 90-degree hybrid 33 and the y-polarized component $LO_y$ of the local oscillation light is input to the 90-degree hybrid 34.

The 90-degree hybrid 33 performs a detection by causing the x-polarized component $LO_x$ of the local oscillation light and the x-polarized component $x_{in}$ to interfere with each other, and outputs an I (in-phase) component (referred to as an $x_{in}$-I component) and Q (quadrature-phase) component (referred to as an $x_{in}$-Q component) whose phase is different from that of the I component by 90 degrees as detected lights. The 90-degree hybrid 34 performs a detection by causing the y-polarized component $LO_y$ of the local oscillation light and the y-polarized component $y_{in}$ to interfere with each other, and outputs an I component (referred to as a $y_{in}$-I component) and Q component (referred to as a $y_{in}$-Q component) as detected lights.

The optical/electrical converters 41 to 44 photoelectrically convert the four optical signals (the $x_{in}$-I component, the $x_{in}$-Q component, the $y_{in}$-I component and the $y_{in}$-Q component) output from the 90-degree hybrids 33 and 34, respectively. Then the optical/electrical converters 41 to 44 output analog electric signals generated by the optical/electrical conversions to the ADCs 51 to 54, respectively. Specifically, the optical/electrical converter 41 photoelectrically converts the $x_{in}$-I component and outputs the generated analog electric signal to the ADC 51. The optical/electrical converter 42 photoelectrically converts the $x_{in}$-Q component and outputs the generated analog electric signal to the ADC 52. The optical/electrical converter 43 photoelectrically converts the $y_{in}$-I component and outputs the generated analog electric signal to the ADC 53. The optical/electrical converter 44 photoelectrically converts the $y_{in}$-Q component and outputs the generated analog electric signal to the ADC 54.

The ADCs 51 to 54 convert the analog electric signals output from the optical/electrical converters 41 to 44 into digital signals and output the converted digital signals to the DSP 35, respectively.

The DSP 35 performs predetermined polarization separation digital signal processing on the input digital signals and outputs the data signal DAT including the demodulated signal. The data signal DAT is output to the external optical communication apparatus 93 through the pluggable electric connector 11.

The pluggable optical receptor 15A is configured in such a manner that the connector of the external optical fiber 91 with connector is insertable into and removable from the pluggable optical receptor 15A. The optical signal LS1 output from the optical transmission unit 12 is output to the optical fiber 91 through the pluggable optical receptor 15A. The pluggable optical receptor 15B is configured in such a manner that the connector of the external optical fiber 92 with connector is insertable into and removable from the pluggable optical receptor 15B. The optical signal LS2 propagating through the optical fiber 92 from the outside is input to the optical reception unit 13 through the pluggable optical receptor 15B. Here, although the pluggable optical receptor 15A and the pluggable optical receptor 15B are disposed separately, it should be appreciated that the pluggable optical receptor 15A and the pluggable optical receptor 15B may be configured as a combined single pluggable optical receptor.

Figure 6:
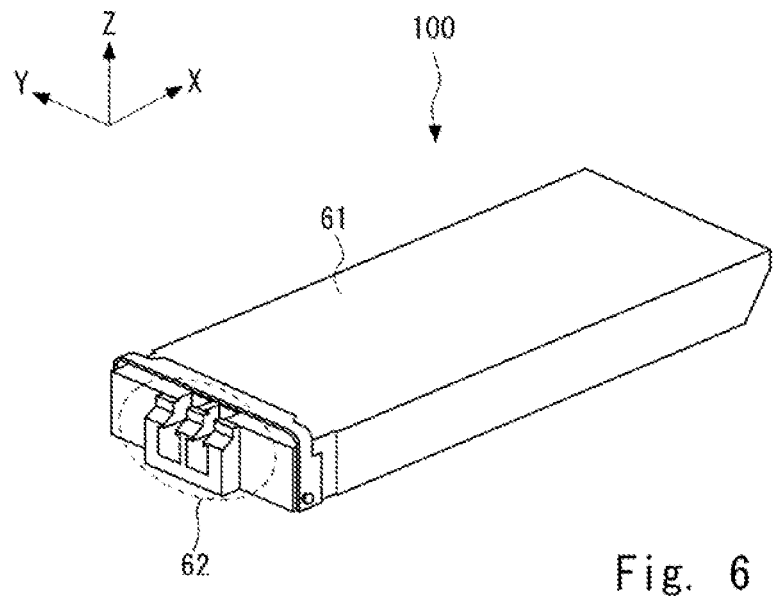
FIG. 6 is a perspective view of the pluggable optical module according to the first exemplary embodiment observed from a side of an external optical fiber.
Figure 7:
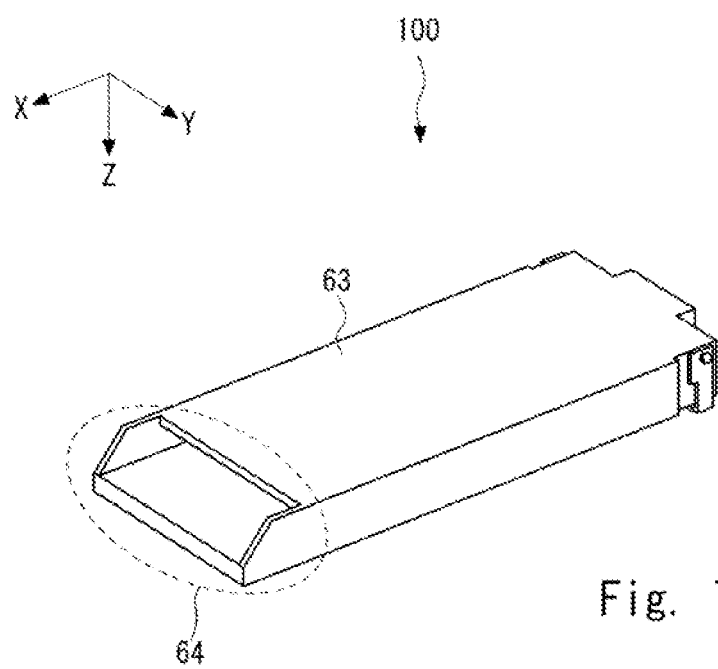
FIG. 7 is a perspective view of the pluggable optical module according to the first exemplary embodiment observed from a side of an optical communication apparatus.

An appearance of the wavelength-tunable pluggable optical module 100 will be described. FIG. 6 is a perspective view of the pluggable optical module 100 according to the first exemplary embodiment observed from a side of the optical fibers 91 and 92. A numerical sign 61 illustrated in FIG. 6 indicates an upper surface of the pluggable optical module 100. A numerical sign 62 illustrated in FIG. 6 indicates insertion ports of the pluggable optical receptors 15A and 15B, which a connector of the optical fiber is inserted into. FIG. 7 is a perspective view of the pluggable optical module 100 according to the first exemplary embodiment observed from a side of the optical communication apparatus 93. A numerical sign 63 illustrated in FIG. 7 indicates a lower surface of the pluggable optical module 100. A numerical sign 64 illustrated in FIG. 7 indicates a connection part of the pluggable electric connector 11, which is connected with the optical communication apparatus 93.

As described above, according to the present configuration, in the pluggable optical module used for the digital coherent communication, by disposing only one wavelength-tunable light source, it is possible to provide the light to be modulated to the optical transmission unit and provide the local oscillation light used for detecting the optical signal received by the optical reception unit. In sum, it is unnecessary to separately dispose a light source for providing the light to be modulated by the optical transmission unit and a light source for providing the local oscillation light used for detecting the optical signal received by the optical reception unit.

Thus, according to the present configuration, it is possible to achieve miniaturization of the pluggable optical module used for the digital coherent communication. Additionally, it is possible to decrease the number of the wavelength-tunable light sources and thereby decrease a manufacturing cost.

Second Exemplary Embodiment

Figure 8:
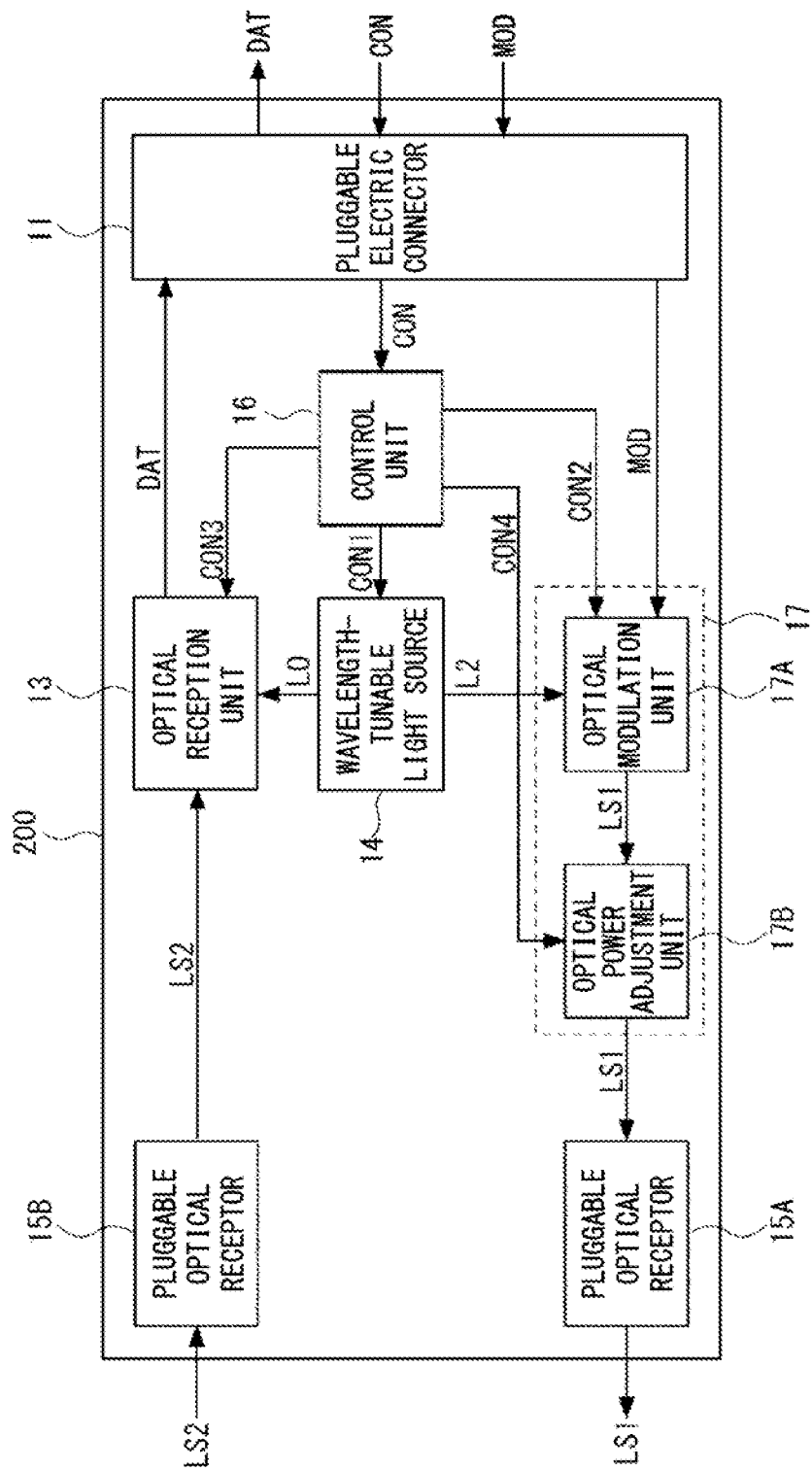
FIG. 8 is a block diagram schematically illustrating a configuration of a pluggable optical module according to a second exemplary embodiment.

Next, a pluggable optical module 200 according to a second exemplary embodiment will be described. The pluggable optical module 200 is a modified example of the pluggable optical module 100 according to the first exemplary embodiment. FIG. 8 is a block diagram schematically illustrating a configuration of the pluggable optical module 200 according to the second exemplary embodiment. The pluggable optical module 200 has a configuration in which the optical transmission unit 12 of the pluggable optical module 100 is replaced with an optical transmission unit 17 and a control unit 16 is added. Because other configurations of the pluggable optical module 200 are the same as those of the pluggable optical module 100, descriptions of those will be omitted.

The control unit 16 controls operations of the wavelength-tunable light source 14, optical transmission unit 17, and the optical reception unit 13 based on the control signal CON input from the optical communication apparatus 93 through the pluggable electric connector 11. Specifically, the control unit 16 generates control signals CON1 to CON4 based on the control signal CON. The control signal CON1 is output to the wavelength-tunable light source 14, in the same manner as the pluggable optical module 100. The control signals CON2 and CON4 are output to the optical transmission unit 17. The control signal CON3 is output to the optical reception unit 13, in the same manner as the pluggable optical module 100.

The optical transmission unit 17 will be described. The optical transmission unit 17 includes an optical modulation unit 17A and an optical power adjustment unit 17B. Because the optical modulation unit 17A has the same configuration as the optical transmission unit 12 of the pluggable optical module 100, a description of that will be omitted.

The optical power adjustment unit 17B adjusts the power of the optical signal LS1 in response to the control signal CON4 output from the control unit 16. For example, the optical power adjustment unit 17B can adjust the power of the optical signal LS1 by attenuating or blocking the optical signal LS1 output from the optical modulation unit 17A. For example, an optical attenuator can be used as the optical power adjustment unit 17B.

As described above, according to the present configuration, it is possible to easily adjust the power of the optical signal to be output by disposing the optical power adjustment unit in the optical transmission unit. Further, in the present configuration, the control unit can specifically control each component (the wavelength-tunable light source, the optical transmission unit, and the optical reception unit) in the pluggable optical module 200 according to purpose of use.

Third Exemplary Embodiment

Figure 9:
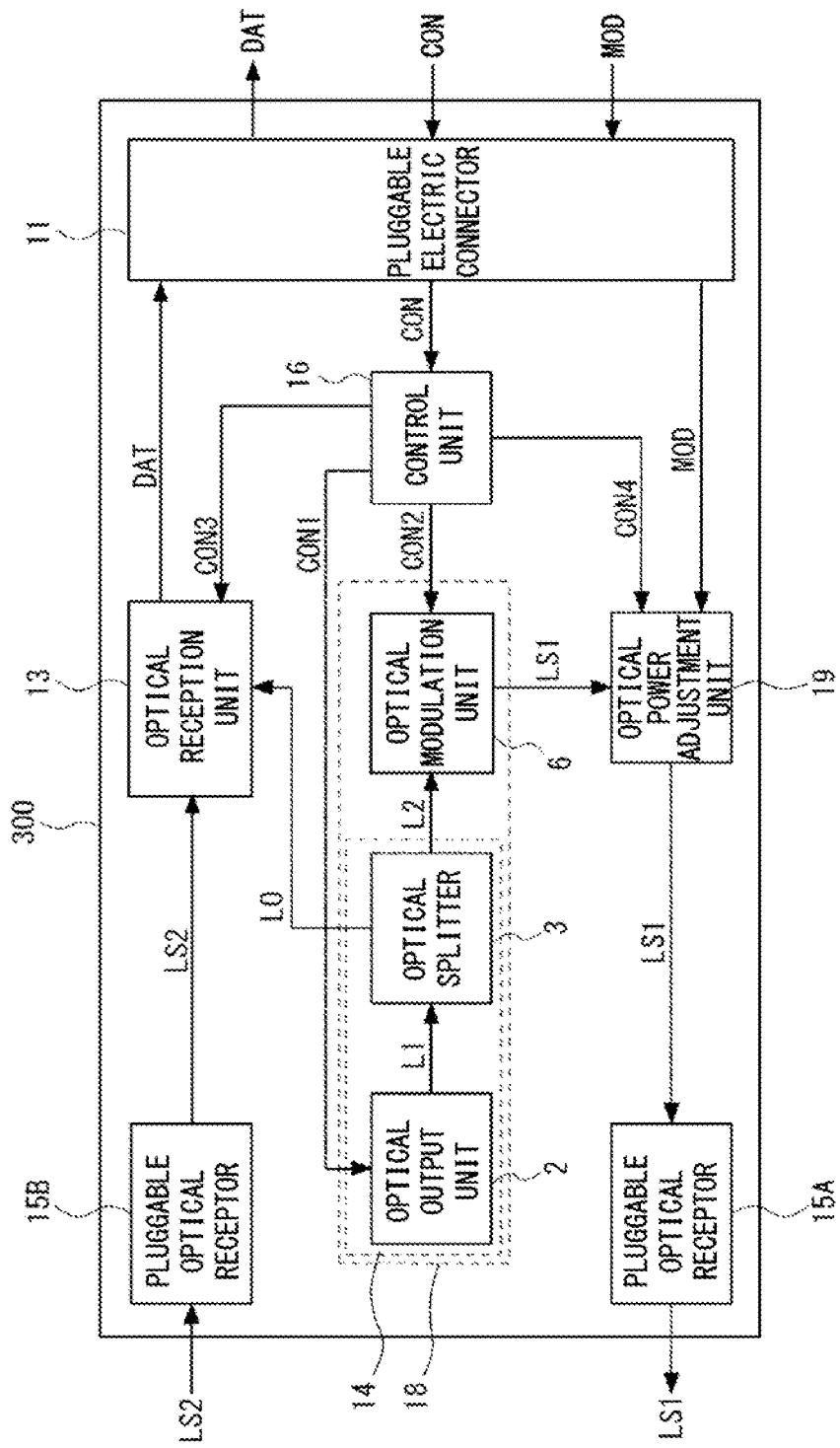
FIG. 9 is a block diagram schematically illustrating a configuration of a pluggable optical module according to a third exemplary embodiment.

Next, a pluggable optical module 300 according to a third exemplary embodiment will be described. The pluggable optical module 300 is a modified example of the pluggable optical module 100 according to the third exemplary embodiment. FIG. 9 is a block diagram schematically illustrating a configuration of the pluggable optical module 300 according to the third exemplary embodiment. The pluggable optical module 300 has a configuration in which the wavelength-tunable light source 14 and the optical transmission unit 12 of the pluggable optical module 100 are integrated into an optical transmission unit 18 and an optical power adjustment unit 19 is added. Because other configurations of the pluggable optical module 300 are the same as those of the pluggable optical module 100, descriptions of those will be omitted.

The optical transmission unit 18 will be described. The optical transmission unit 18 includes the wavelength-tunable light source 14 and an optical modulation unit 6. The optical output unit 2, the optical branching unit 3, and the optical modulation unit 6 are mounted or formed on the carrier 1, for example, just like the wavelength-tunable light source 14. For simplification of the drawing, the carrier 1 is omitted in FIG. 9. Because the optical modulation unit 6 is the same as the optical transmission unit 12 described above, a description of that will be omitted. As described above, it can be understood that the pluggable optical module 300 has a configuration in which the functions of the wavelength-tunable light source 14 and the optical transmission unit 12 in the pluggable optical module 100 are integrated into the single optical transmission unit 18 (it may be also understood as an optical modulation module).

The optical power adjustment unit 19 is the same as the optical power adjustment unit 17B described above, a description of that will be omitted.

As described above, according to the present configuration, the optical output unit, the optical branching unit, and the optical modulation unit (i.e. the optical transmission unit) can be integrated into a single device. As a result, the wavelength-tunable light source and the optical transmission unit can be configured as a single optical modulation module. Especially, when the optical output unit, the optical branching unit, and the optical modulation unit are manufactured as a semiconductor device, a manufacturing cost of an integrated optical modulation module can be reduced because a common process can be applied.

In this case, the integrated optical modulation module can be configured using quartz, semiconductor (e.g. silicon, compound semiconductor such as InP [Indium phosphide]), or the like. The integrated optical modulation module may also include a beam spot converter that shapes a beam spot of a light to be output.

Further, it should be appreciated that the optical power adjustment unit may be included in the optical transmission unit in the present exemplary embodiment.

Fourth Exemplary Embodiment

Figure 10:
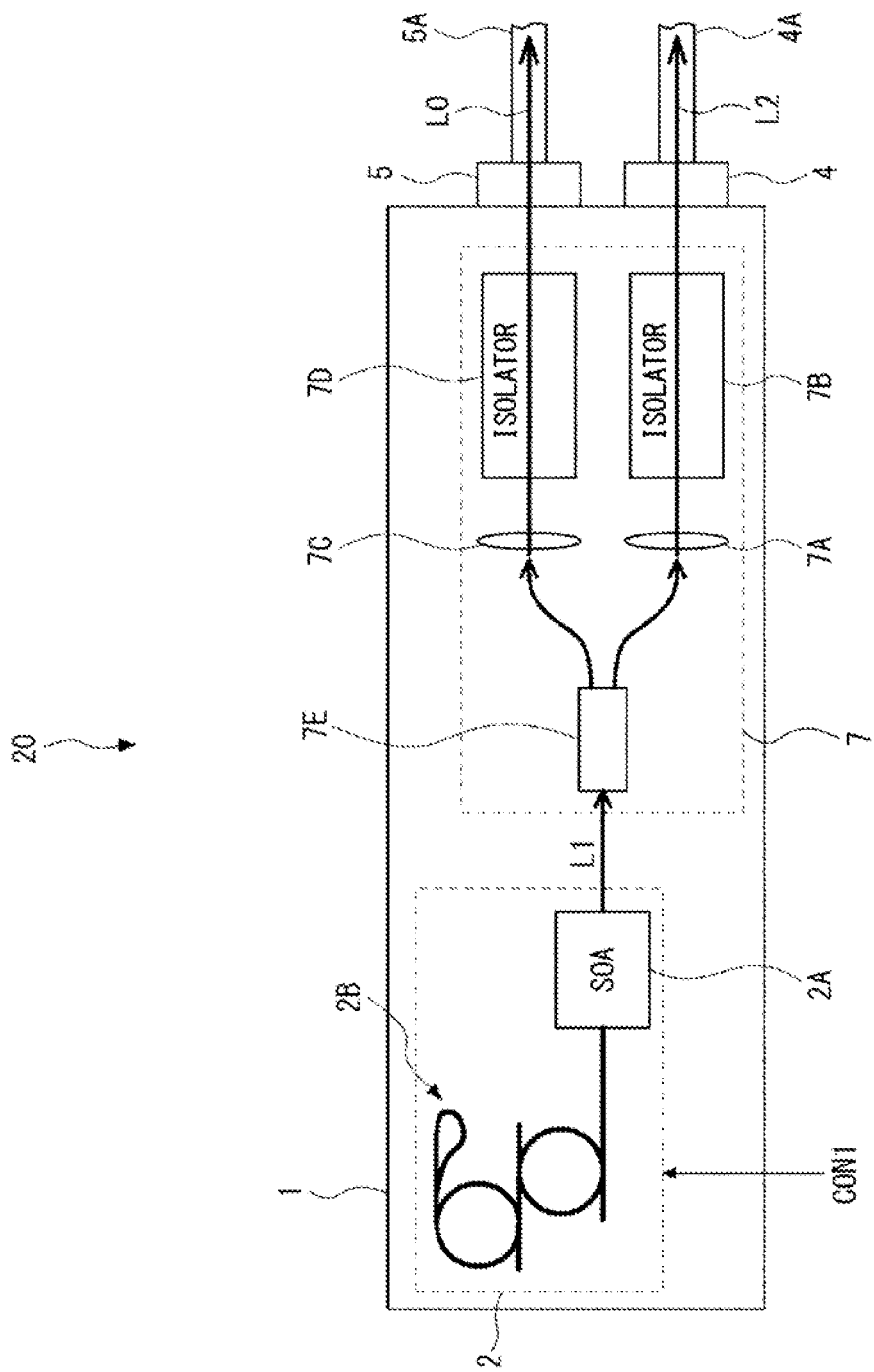
FIG. 10 is a diagram illustrating an example of a wavelength-tunable light source according to a fourth exemplary embodiment.

In the present exemplary embodiment, a modified example of the wavelength-tunable light source 14 will be described. FIG. 10 is a diagram illustrating an example of a wavelength-tunable light source according to a fourth exemplary embodiment. A wavelength-tunable light source 20 illustrated in FIG. 10 has a configuration in which the optical branching unit 3 of the wavelength-tunable light source 14 is replaced with an optical branching unit 7. The optical branching unit 7 includes a collimator lens 7A, an isolator 7B, a collimator lens 7C, an isolator 7D, and a coupler 7E. The coupler 7E branches the light L1 output from the SOA 2A into the output light L2 and the local oscillation light LO. The light L1 is transmitted through the collimator lens 7A, the isolator 7B and the condenser lens 4, and is output to the optical transmission unit. The local oscillation light LO is transmitted through the collimator lens 7C, the isolator 7D and the condenser lens 5, and is output to the optical transmission unit. Because other configurations of the wavelength-tunable light source 20 are the same as those of the wavelength-tunable light source 14, descriptions of those will be omitted.

As described above, compared to the wavelength-tunable light source 14, the wavelength-tunable light source 20 can branch the light output from the optical output unit 2 without using the prism or the mirror.

Figure 11:
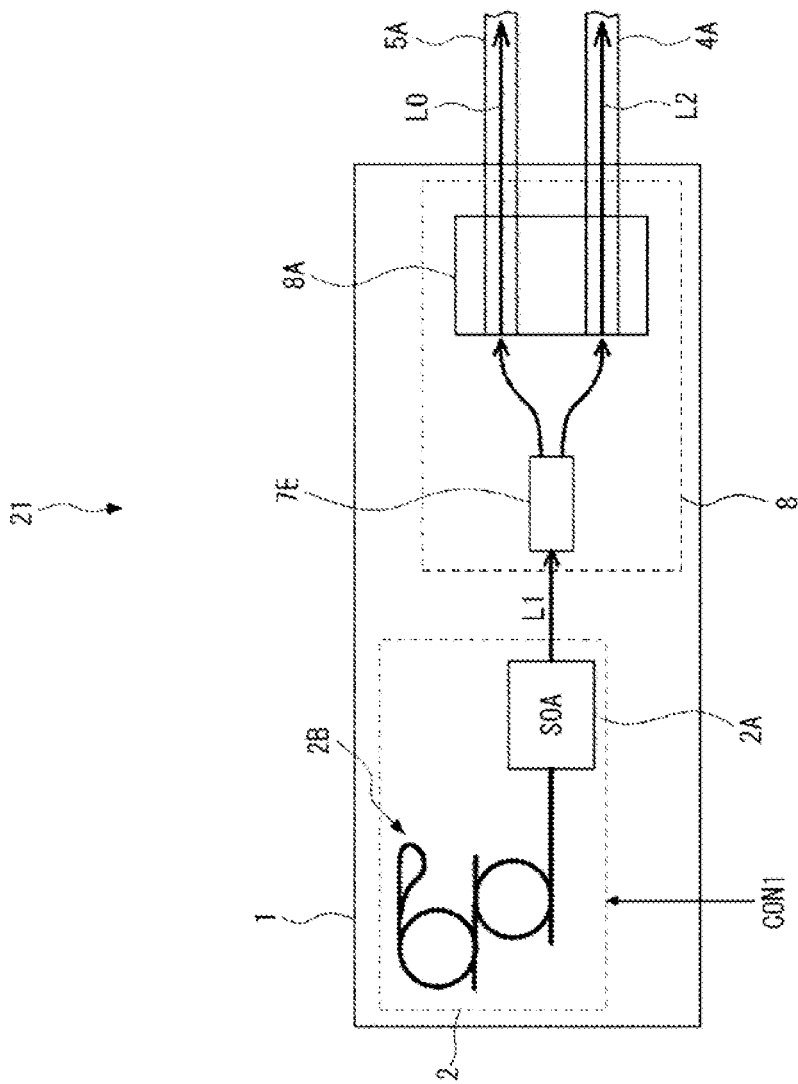
FIG. 11 is a diagram illustrating an example of a wavelength-tunable light source according to the fourth exemplary embodiment.

Further, another modified example of the wavelength-tunable light source 14 will be described. FIG. 11 is a diagram illustrating another example of a wavelength-tunable light source according to a fourth exemplary embodiment. A wavelength-tunable light source 21 illustrated in FIG. 11 has a configuration in which the optical branching unit 3 of the wavelength-tunable light source 14 is replaced with an optical branching unit 8 and the condenser lenses 4 and 5 of the wavelength-tunable light source 14 are removed. The optical branching unit 8 includes an optical fiber array 8A and the coupler 7E. The coupler 7E branches the light L1 output from the SOA 2A into the output light L2 and the local oscillation light LO, just like the wavelength-tunable light source 20. In the optical fiber array 8A, the optical fiber 4A and the optical fiber 5A are fixed in parallel. The output light L2 is incident on an end face of the optical fiber 4A and the local oscillation light LO is incident on an end face of the optical fiber 5A. Because other configurations of the wavelength-tunable light source 21 are the same as those of the wavelength-tunable light source 14, descriptions of those will be omitted.

As described above, the wavelength-tunable light source 21 has the simple configuration in which the lights branched by the coupler 7E are directly incident on the optical fibers. In sum, since the wavelength-tunable light source can be achieved without the prism, the mirror, the collimator lens, and the isolator, the wavelength-tunable light source 21 can be miniaturized and manufactured at a low cost with simple manufacturing process as compared with the wavelength-tunable light sources 14 and 20.

Fifth Exemplary Embodiment

A pluggable optical module according to a fifth exemplary embodiment will be described. It has been described that the optical transmission unit 12, the optical modulation units 6 and 17A described above are configured as the general Mach-Zehnder type optical modulator that includes two arms. In contrast, in the present exemplary embodiment, an optical transmission unit 70 including the Mach-Zehnder type optical modulator and capable of outputting the QPSK optical signal, which is used as the optical transmission unit 12, the optical modulation units 6 and 17A.

Figure 12:
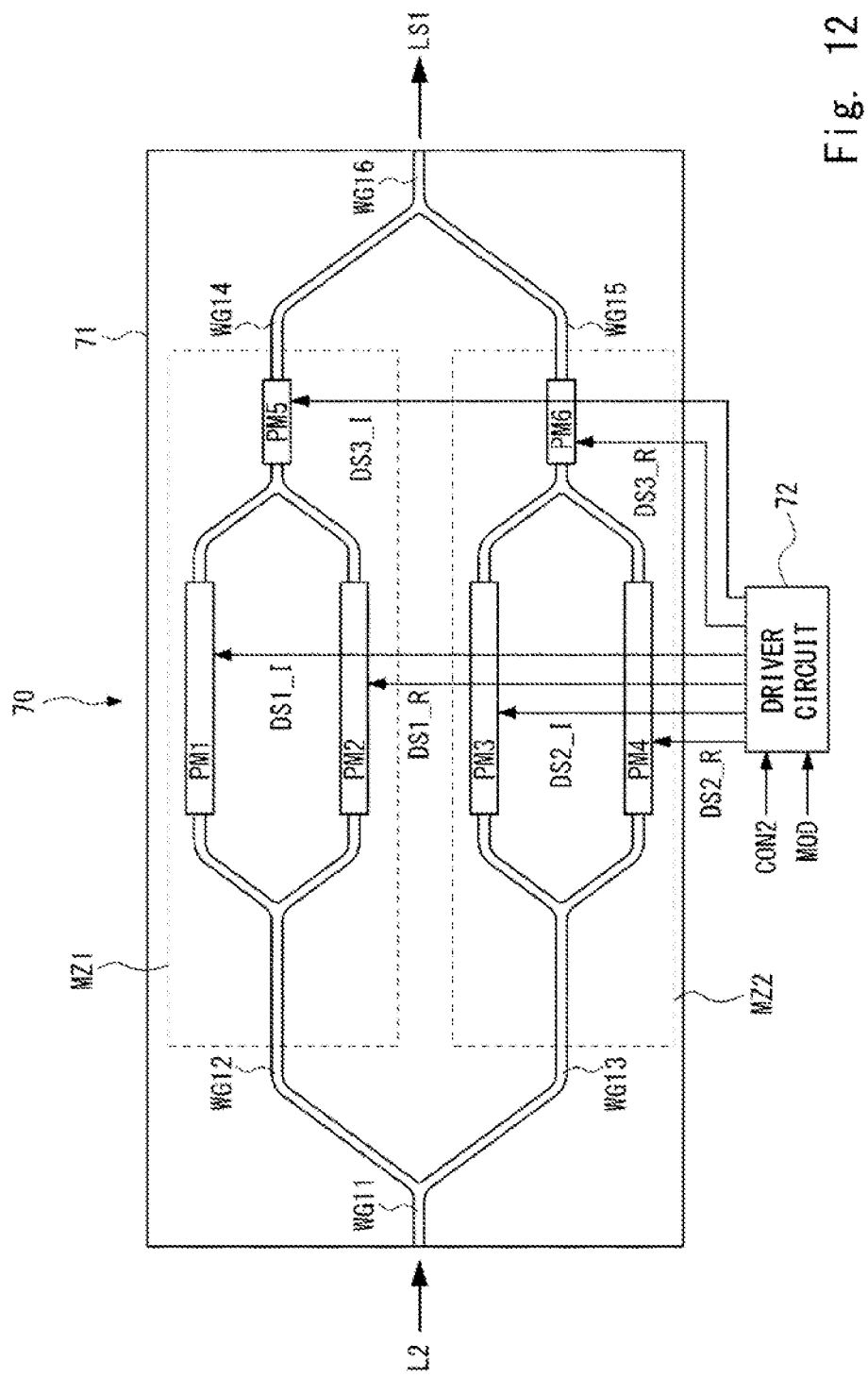
FIG. 12 is a block diagram schematically illustrating a configuration of an optical transmission unit 70 according to a fifth exemplary embodiment.

FIG. 12 is a block diagram schematically illustrating a configuration of the optical transmission unit 70 according to the fifth exemplary embodiment. The optical transmission unit 70 includes an optical modulator 71 and a driver circuit 72. The optical modulator 71 has a configuration in which a plurality of general Mach-Zehnder type optical modulators are combined. In this example, the optical modulator 71 has a configuration in which two Mach-Zehnder type optical modulators MZ1 and MZ2 are combined. The Mach-Zehnder type optical modulators MZ1 and MZ2 are arranged in parallel and each have the same configuration as the optical transmission unit 12 as described in the first exemplary embodiment.

The output light L2 is input to an optical waveguide WG11. The optical waveguide WG11 is branched into an optical waveguide WG12 and an optical waveguide WG13. The optical waveguide WG12 is connected with an input of the Mach-Zehnder type optical modulator MZ1 and the optical waveguide WG13 is connected with an input of the Mach-Zehnder type optical modulator MZ2.

An output of the Mach-Zehnder type optical modulator MZ1 is connected with an optical waveguide WG14 and an output of the Mach-Zehnder type optical modulator MZ2 is connected with an optical waveguide WG15. The optical waveguide WG14 and the optical waveguide WG15 join together and are connected with an optical waveguide WG16. The optical signal LS1 is output from the optical waveguide WG16 to the outside.

Note that, in the present exemplary embodiment, the phase modulation areas PMA and PMB disposed on two optical waveguides of the Mach-Zehnder type optical modulator MZ1 are referred to as phase modulation areas PM1 and PM2, respectively. The phase modulation areas PMA and PMB disposed on two optical waveguides of the Mach-Zehnder type optical modulator MZ2 are referred to as phase modulation areas PM3 and PM4, respectively. Additionally, phase modulation areas PM5 and PM6 are disposed on the optical waveguides WG14 and WG15, respectively.

The driver circuit 72 can control a modulation operation of the optical modulator 71 and also control a bias point of the optical modulator 71 by applying a bias voltage to each of the phase modulation areas PM1 to PM6. Further, the driver circuit 72 can modulate the output light L2 to the optical signal LS1 by applying the modulation signal to each of the phase modulation areas PM1 to PM6.

For example, the driver circuit 72 applies either of a pair of differential signals to the phase modulation areas PM1 and PM2. Specifically, for example, a normal phase modulation signal DS1_I is applied to the phase modulation area PM1, and a reversed phase modulation signal DS1_R that is a signal generated by reversing the normal phase modulation signal DS1_I is applied to the phase modulation area PM2. Therefore, it is possible to generate a phase difference of 180 degrees between an optical signal modulated by the phase modulation area PM1 and an optical signal modulated by the phase modulation area PM2.

Further, for example, the driver circuit 72 applies either of a pair of differential signals to each of the phase modulation areas PM3 and PM4. Specifically, for example, a normal phase modulation signal DS2_I is applied to the phase modulation area PM3, and a reversed phase modulation signal DS2_R that is a signal generated by reversing the normal phase modulation signal DS2_I is applied to the phase modulation area PM4. Therefore, it is possible to generate a phase difference of 180 degrees between an optical signal modulated by the phase modulation area PM3 and an optical signal modulated by the phase modulation area PM4.

Furthermore, for example, the driver circuit 72 applies either of a pair of differential signals to each of the phase modulation areas PM5 and PM6. Specifically, for example, a normal phase modulation signal DS3_I is applied to the phase modulation area PM5, and a reversed phase modulation signal DS3_R that is a signal generated by reversing the normal phase modulation signal DS3_I is applied to the phase modulation area PM6. Therefore, it is possible to generate a phase difference of 90 degrees between an optical signal modulated by the phase modulation area PM5 and an optical signal modulated by the phase modulation area PM6.

As described above, when a phase of the optical signal output from the phase modulation area PM5 is 0° or 180°, a phase of the optical signal output from the phase modulation area PM6 is 90° or 270°. As a result, it can be understood that the optical signal LS1 output from the optical transmission unit 70 is the QPSK optical signal that is modulated with the quadrature phase shift keying method.

In the present configuration, the bias voltages applied to the phase modulation areas PM1 to PM6 of the optical modulation unit 71 may be determined by predetermined control means (e.g. the optical communication apparatus 93 or the control unit 16).

As described above, according to the present configuration, it is possible to achieve the pluggable optical module capable of outputting the QPSK signal.

In the present exemplary embodiment, the optical transmission unit outputting the QPSK signal has been described and, however, it is merely an example. For example, it should be appreciated that an optical transmission unit using other modulation methods such as DP-QPSK and QAM can be appropriately applied to the pluggable optical module.

Other Exemplary Embodiments

The present invention is not limited to the above-described exemplary embodiments, and can be modified as appropriate without departing from the scope of the invention.

For example, in the exemplary embodiments described above, the configuration in which the optical output unit and the optical reception unit are separately disposed has been described, and, however, the configuration is not limited to this configuration. For example, the optical output unit and the optical reception unit may be configured as a single integrated optical module and the output light and the local oscillation light may be incident on the integrated optical module. Further, the light L1 may be input to the integrated optical module from the optical output unit and the light L1 may be branched into the output light and the local oscillation light in the integrated optical module. In sum, the integrated optical module may include a function of the optical branching unit in the wavelength-tunable light source described above.

In the exemplary embodiments described above, although it is described that the wavelength-tunable light source, the optical transmission unit, the optical reception unit, and the optical power adjustment unit are controlled in response to the control signal CON output from the optical communication apparatus 93, it is merely an example. The pluggable optical module may autonomously control the wavelength-tunable light source, the optical transmission unit, the optical reception unit, and the optical power adjustment unit without depending on the control signal received from the outside.

In the exemplary embodiments described above, the communication of the control signal through the pluggable electric connector 11 can be achieved by applying technologies such as a MDIO (Management Data Input/Output) or an I2C (Inter-Integrated Circuit).

In the exemplary embodiments described above, the power of the optical signal output from the optical transmission unit or the optical power adjustment unit may be monitored and, for example, the optical output power of the wavelength-tunable light source or the optical power adjustment operation of the optical power adjustment unit may be feedback-controlled. In this case, a part of the light output from the optical transmission unit or the optical power adjustment unit is branched by an optical branching unit or the like and the branched light is monitored by a light receiving device such as a photodiode. Then, the control unit can feedback-control the optical output power of the wavelength-tunable light source or the optical power adjustment operation of the optical power adjustment unit by notifying the control unit of the monitoring result. Note that this feedback control may be performed in response to a command from the optical communication apparatus 93, or the pluggable optical module may autonomously perform this feedback control.

In the exemplary embodiments described above, although it is described that the optical reception unit 13 receives the DP-QPSK optical signal, it is merely an example. For example, the optical reception unit 13 may be configured to be capable of receiving other modulation signal such as QAM (Quadrature Amplitude Modulation).

In the exemplary embodiments described above, although it has been described that the wavelength-tunable light source includes the SOA and the wavelength filter, other configurations can be adopted as long as these can function as a wavelength-tunable light source. For example, the wavelength-tunable light source may be includes a DFB (Distributed FeedBack) laser array and selection unit that selects a laser lights among laser lights output from a plurality of DFB lasers included in the DFB laser array. Further, instead of the DFB (Distributed FeedBack) laser array, a laser array including another type of laser such as a DBR (Distributed Bragg Reflector) laser may be used.

The present invention has been described above with reference to the exemplary embodiments, but the present invention is not limited to the above exemplary embodiments. The configuration and details of the present invention can be modified in various ways which can be understood by those skilled in the art within the scope of the invention.

REFERENCE SIGNS LIST

1 CARRIER
2 OPTICAL OUTPUT UNIT
2A SEMICONDUCTOR OPTICAL AMPLIFIER (SOA)
2B WAVELENGTH FILTER
3, 7, 8 OPTICAL BRANCHING UNITS
3A, 7A, 7C COLLIMATOR LENSES
3B, 7B, 7D ISOLATORS
3C PRISM
3D MIRROR
4, 5 CONDENSER LENSES
4A, 5A OPTICAL FIBERS
6, 17A OPTICAL MODULATION UNITS

7E OPTICAL COUPLER
8A OPTICAL FIBER ARRAY
11 PLUGGABLE ELECTRIC CONNECTOR
12, 17, 18, 70 OPTICAL TRANSMISSION UNITS
12A, 71 OPTICAL MODULATORS
12B, 72 DRIVER CIRCUITS
13 OPTICAL RECEPTION UNITS
14, 20, 21 WAVELENGTH-TUNABLE LIGHT SOURCES
15A, 15B PLUGGABLE OPTICAL RECEPTORS
16 CONTROL UNIT
17B, 19 OPTICAL POWER ADJUSTMENT UNITS
31, 32 POLARIZATION BEAM SPLITTERS (PBSS)
33, 34 90-DEGREE HYBRIDS
35 DIGITAL SIGNAL PROCESSOR (DSP)
41 TO 44 OPTICAL/ELECTRICAL CONVERTERS (O/ES)
51 TO 54 ANALOG TO DIGITAL CONVERTERS (ADCS)
91, 92 OPTICAL FIBERS
93 OPTICAL COMMUNICATION APPARATUS
100, 200, 300 PLUGGABLE OPTICAL MODULES
WG1 TO WG4, WG11 TO WG16 OPTICAL WAVEGUIDES
1000 OPTICAL COMMUNICATION SYSTEM
CON, CON1 TO CON4 CONTROL SIGNALS
DAT DATA SIGNAL
DS1_I, DS2_I, DS3_I NORMAL PHASE MODULATION SIGNALS
DS1_R, DS2_R, DS3_R REVERSED PHASE MODULATION SIGNALS
L1 LIGHT
L2 OUTPUT LIGHT
LO LOCAL OSCILLATION LIGHT
LS1, LS2 OPTICAL SIGNALS
MOD MODULATION SIGNAL
MZ1, MZ2 MACH-ZEHNDER TYPE OPTICAL MODULATORS
PMA, PMB, PM1 TO PM6 PHASE MODULATION AREAS
SIG_M1, SIG_M2 MODULATION SIGNALS
VBISA BIAS VOLTAGE

The invention claimed is:

1. An optical transceiver comprising:
a carrier comprising;
a light source configured to output a light;
an isolator configured to transmit the light from the light source;
a splitter configured to split the light from the isolator into an output light and a local oscillation light; and
a modulator configured to modulate the output light based on a first data signal; and
an optical coherent receiver external to the carrier and configured to demodulate an optical signal, by using the local oscillation light, to a second data signal.

2. The optical transceiver according to claim 1, further comprising a pluggable electric connector configured to be insertable into, and removable from, an optical communication apparatus, and configured to communicate the first data signal and the second data signal with the optical communication apparatus,
wherein the modulator is configured to modulate the output light based on the first data signal; and
wherein the optical coherent receiver is configured to output the second data signal corresponding to the optical signal.

3. The optical transceiver according to claim 1, further comprising a pluggable optical receptor configured in such a manner that a first optical fiber and a second optical fiber are insertable into, and removable from, the pluggable optical receptor, and configured to output the modulated output light to the first optical fiber and of transferring the optical signal received through the second optical fiber to the optical coherent receiver.

4. The optical transceiver according to claim 1, wherein the optical transceiver is configured to perform digital coherent communication using the modulated output light and the optical signal.

5. The optical transceiver according to claim 2, further comprising a controller configured to control the light source, the modulator, and the optical coherent receiver in response to a control signal received through the pluggable electric connector.

6. The optical transceiver according to claim 5, wherein the controller is configured to control the light from the light source in response to the control signal.

7. The optical transceiver according to claim 6, wherein the controller is configured to cause the modulator to perform an operation of modulating the output light according to the wavelength of the output light specified by the control signal.

8. The optical transceiver according to claim 6, wherein the controller is configured to cause the optical coherent receiver to perform an operation of demodulating the optical signal according to the wavelength of the local oscillation light specified by the control signal.

9. An optical communication system comprising:
an optical transceiver comprising:
a carrier comprising;
a light source configured to output a light;
an isolator configured to transmit the light from the light source;
a splitter configured to split the light from the isolator into an output light and a local oscillation light; and
a modulator configured to modulate the output light based on a first data signal; and
an optical coherent receiver external to the carrier and configured to demodulate an optical signal, by using the local oscillation light, to a second data signal;
a first optical fiber configured to propagate the modulated output light;
a second optical fiber configured to propagate the optical signal to the optical coherent receiver; and
an optical communication apparatus configured in such a manner that the optical transceiver is insertable into, and removable from, the optical communication apparatus, wherein the optical transceiver is configured to output the modulated output light to the first optical fiber, to receive the optical signal from the second optical fiber, and to transfer the received optical signal to the optical coherent receiver, and
wherein the first optical fiber and the second optical fiber are insertable into, and
removable from, the optical transceiver.

10. The optical transceiver according to claim 1, wherein the modulator is a Mach-Zehnder modulator.

11. The optical transceiver according to claim 1, wherein the splitter is configured to transmit the output light,
wherein the splitter is configured to reflect the local oscillation light.

12. The optical transceiver according to claim 1, further comprising a pluggable electric connector configured to be insertable into, and removable from, an optical communication apparatus,
 wherein the modulator is configured to input the first data signal from the optical communication apparatus through the pluggable electric connector.

\* \* \* \* \*